United States Patent
Kim (10) Patent No.: US 10,283,184 B2
(45) Date of Patent: May 7, 2019

(54) NONVOLATILE MEMORY DEVICE HAVING FERROELECTRIC MEMORY ELEMENT AND RESISTIVE MEMORY ELEMENT AND METHOD OF WRITING SIGNAL IN NONVOLATILE MEMORY DEVICE HAVING THE SAME

(71) Applicant: SK hynix Inc., Icheon (KR)

(72) Inventor: Joong Sik Kim, Yongin (KR)

(73) Assignee: SK HYNIX INC., Icheon (KR)

( * ) Notice: Subject to any disclaimer, the term of this patent is extended or adjusted under 35 U.S.C. 154(b) by 18 days.

(21) Appl. No.: 15/632,113

(22) Filed: Jun. 23, 2017

(65) Prior Publication Data

US 2018/0114560 A1    Apr. 26, 2018

(30) Foreign Application Priority Data

Oct. 26, 2016    (KR) .................... 10-2016-0140284

(51) Int. Cl.

| | |
|---|---|
| *G11C 11/22* | (2006.01) |
| *H01L 29/78* | (2006.01) |
| *H01L 27/11597* | (2017.01) |
| *H01L 43/02* | (2006.01) |
| *H01L 43/08* | (2006.01) |
| *H01L 43/10* | (2006.01) |
| *H01L 45/00* | (2006.01) |
| *G11C 11/00* | (2006.01) |
| *G11C 11/56* | (2006.01) |
| *G11C 11/16* | (2006.01) |

(52) U.S. Cl.
CPC ........ *G11C 11/2275* (2013.01); *G11C 11/005* (2013.01); *G11C 11/1675* (2013.01); *G11C 11/223* (2013.01); *G11C 11/5607* (2013.01); *G11C 11/5657* (2013.01); *H01L 27/11597* (2013.01); *H01L 29/78391* (2014.09); *H01L 43/02* (2013.01); *H01L 43/08* (2013.01); *H01L 43/10* (2013.01); *H01L 45/12* (2013.01)

(58) Field of Classification Search
CPC .............. G11C 11/223; G11C 11/5657; G11C 11/1675; G11C 11/2277; G11C 11/005; G11C 11/5607; H01L 29/78391; H01L 27/11592; H01L 43/02; H01L 43/08; H01L 43/10; H01L 45/12
USPC .............. 365/145, 158, 171, 49.13, 65, 100
See application file for complete search history.

(56) References Cited

U.S. PATENT DOCUMENTS

| | | | |
|---|---|---|---|
| 5,912,835 A * | 6/1999 | Katoh ................ | G11C 11/22 365/145 |
| 9,178,040 B2 * | 11/2015 | Ting ................ | H01L 29/66666 |
| 9,263,672 B2 | 2/2016 | Ramaswamy et al. | |
| 2009/0290404 A1 * | 11/2009 | Kaneko ............ | G11C 11/22 365/145 |
| 2014/0131794 A1 * | 5/2014 | Ting ................ | H01L 29/66666 257/334 |
| 2014/0339631 A1 | 11/2014 | Ting et al. | |

* cited by examiner

*Primary Examiner* — Gene N Auduong (57) ABSTRACT

Disclosed is a nonvolatile memory device. The nonvolatile memory device includes a ferroelectric memory element including a field effect transistor having a ferroelectric gate dielectric layer and a drain electrode. The nonvolatile memory device also includes a resistive memory element electrically connected in series to the drain electrode of the field effect transistor. A multilevel signal is stored in the nonvolatile memory device according to a channel resistance of the ferroelectric memory element and a resistance of the resistive memory element.

20 Claims, 6 Drawing Sheets

NONVOLATILE MEMORY DEVICE HAVING FERROELECTRIC MEMORY ELEMENT AND RESISTIVE MEMORY ELEMENT AND METHOD OF WRITING SIGNAL IN NONVOLATILE MEMORY DEVICE HAVING THE SAME

CROSS-REFERENCE TO RELATED APPLICATION

The present application claims priority under 35 U.S.C 119(a) to Korean Patent Application No. 10-2016-0140284, filed on Oct. 26, 2016, which is herein incorporated by reference in its entirety.

BACKGROUND

1. Technical Field

Various embodiments of the present disclosure generally relate to a nonvolatile memory device and a method of writing a signal in the nonvolatile memory device.

2. Related Art

Recently, various kinds of nonvolatile memory devices have been proposed in addition to flash memory devices. In a flash memory device, the resistance state of an internal memory element can be reversibly changed in response to an externally applied voltage and different electric signals can be non-volatilely stored on the basis of the changed resistance state. The nonvolatile memory devices may, for example, include a magnetic random access memory (magnetic RAM, MRAM), a phase change RAM (PCRAM), a resistive RAM (ReRAM), or the like.

SUMMARY

According to an embodiment of the present disclosure, there is provided a nonvolatile memory device. The nonvolatile memory device includes a ferroelectric memory element including a field effect transistor having a ferroelectric gate dielectric layer and a drain electrode. The nonvolatile memory device also includes a resistive memory element electrically connected in series to the drain electrode of the field effect transistor. A multilevel signal is stored in the nonvolatile memory device according to a channel resistance of the ferroelectric memory element and a resistance of the resistive memory element.

According to another embodiment of the present disclosure, there is provided a nonvolatile memory device. The nonvolatile memory device includes a semiconductor substrate including a trench. The trench is formed from a surface of the semiconductor substrate. The nonvolatile memory device also includes a ferroelectric gate dielectric layer disposed along an inner wall of the trench in the semiconductor substrate, and a gate electrode layer disposed on the ferroelectric gate dielectric layer. The gate electrode layer is connected to a word line. The nonvolatile memory device also includes a source electrode region disposed on a first side of the trench and a drain electrode region disposed on a second side of the trench. The second side is an opposite side of the trench to the first side. The nonvolatile memory device also includes a first contact wiring disposed over the drain electrode region, a free layer, a tunnel barrier layer and a fixed layer sequentially disposed over the first contact wire, and a second contact wire disposed over the fixed layer and connected to a bit line. The source electrode region is connected to a source line. A polarization direction of the ferroelectric gate dielectric layer is changed when a first switching voltage is applied to the gate electrode layer, and a magnetization direction of the free layer is changed when a second switching voltage is applied between the free layer and the fixed layer. An absolute value of the first switching voltage and an absolute value of the second switching voltage are different from each other.

According to another embodiment of the present disclosure, there is provided a method of writing a signal in a nonvolatile memory device. The method includes determining a target memory cell among a plurality of memory cells, the target memory cell comprising a ferroelectric memory element and a magnetic memory element, the ferroelectric memory element including a field effect transistor having a ferroelectric gate dielectric layer, the magnetic memory element being electrically connected in series to a drain electrode of the field effect transistor and having a free layer, a tunnel barrier layer, and a fixed layer. The method also includes changing a channel resistance in the ferroelectric memory element by applying a first switching voltage to a gate electrode of the field effect transistor of the target memory cell, and changing a magnetic resistance in the magnetic memory element by applying a second switching voltage between the free layer and the fixed layer of the magnetic memory element of the target memory cell. At this time, changing the magnetic resistance and changing the channel resistance are performed sequentially.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments will now be described hereinafter with reference to the accompanying drawings. In the drawings, the dimensions of layers and regions may be exaggerated for clarity of illustration. The drawings are described in the observer's point overall, if an element is referred to be located on another element, it may be understood that the element is directly located on the other element, or an additional element may be interposed between the element and the other element. The same reference numerals refer to the same elements throughout the specification.

In addition, expression of the singular form of a word should be understood to include the plural forms of the word unless clearly used otherwise in context. It will be understood that the terms "comprise" or "have" are intended to specify the presence of a feature, a number, a step, an operation, an element, a part or combinations thereof, but not used to preclude the presence or possibility of additional one or more other features, numbers, steps, operations, components, parts, or combinations thereof.

Further, in performing a method described herein, the steps constituting the method can be performed differently from the order, unless a specific sequence is described explicitly in the context. In other words, the steps may be performed in the same manner as the stated order, may be performed substantially at the same time, or may be performed in a reverse order.

An embodiment of the present disclosure provides a nonvolatile memory device having a memory cell that stores a multi-level signal. In addition, an embodiment of the present disclosure provides a method of writing a multi-level signal in a memory cell of a nonvolatile memory device.

Figure 1:
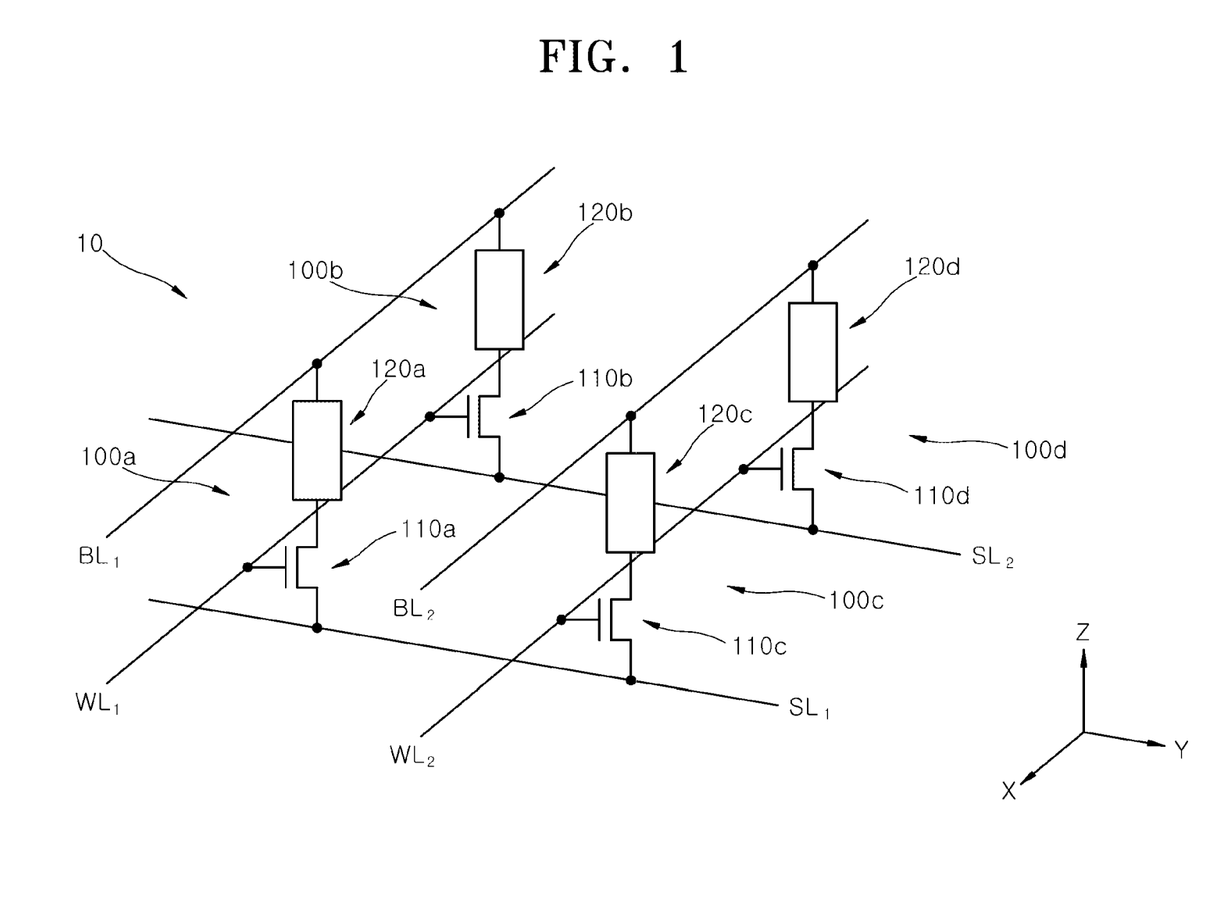
FIG. 1 is a schematic view illustrating a nonvolatile memory device according to an embodiment of the present disclosure.

FIG. 1 is a schematic view illustrating a nonvolatile memory device 10 according to an embodiment of the present disclosure. Referring to FIG. 1, the nonvolatile memory device 10 may include a plurality of bit lines BL1 and BL2, word lines WL1 and WL2, and source lines SL1 and SL2. The plurality of bit lines BL1 and BL2 and the plurality of word lines WL1 and WL2 may be parallel to an x-direction, and the plurality of source lines SL1 and SL2 may be parallel to a y-direction. The y-direction is not parallel to the x-direction.

The nonvolatile memory device 10 may include a plurality of memory cells 100a, 100b, 100c, and 100d. Hereinafter, for the convenience of description, the plurality of memory cells 100a, 100b, 100c, and 100d are referred to as a first memory cell 100a, a second memory cell 100b, a third memory cell 100c, and a fourth memory cell 100d, respectively.

The first memory cell 100a may include a first ferroelectric memory element 110a and a first resistive memory element 120a. The second memory cell 100b may include a second ferroelectric memory element 110b and a second resistive memory element 120b. The third memory cell 100c may include a third ferroelectric memory element 110c and a third resistive memory element 120c. The fourth memory cell 100d may include a fourth ferroelectric memory element 110d and a fourth resistive memory element 120d.

The first memory cell 100a may be disposed between a first bit line BL1 and a first source line SL1, which intersect with each other at the first memory cell 100a. A gate electrode of the first ferroelectric memory element 110a of the first memory cell 100a may be connected to a first word line WL1.

Similarly, the second memory cell 100b may be disposed between the first bit line BL1 and a second source line SL2, which intersect with each other at the second memory cell 100b. A gate electrode of the second ferroelectric memory element 110b of the second memory cell 100b may be connected to the first word line WL1. The third memory cell 100c may be disposed between a second bit line BL2 and the first source line SL1, which intersect with each other at the third memory cell 100c. A gate electrode of the third ferroelectric memory element 110c of the third memory cell 100c may be connected to a second word line WL2. The fourth memory cell 100d may be disposed between the second bit line BL2 and the second source line SL2, which intersect with each other at the fourth memory cell 100d. A gate electrode of the fourth ferroelectric memory element 110d of the fourth memory cell 100d may be connected to the second word line WL2.

Accordingly, the nonvolatile memory device 10 may have an array of the plurality of memory cells 100a, 100b, 100c, and 100d. Although four memory cells are illustrated in the drawings, in an embodiment in which more than two bit lines BL1 and BL2, more than two source lines SL1 and SL2 and/or more than two word lines WL1 and WL2 are connected by or included in the nonvolatile memory device 10, more than the four memory cells shown in FIG. 1 may be included in the nonvolatile memory device 10.

Each of the plurality of memory cells 100a, 100b, 100c, and 100d in the nonvolatile memory device 10 may store an electrical signal having a plurality of levels that are distinguished from each other. For example, when the first memory cell 100a is targeted for a write operation, the resistance states of the first ferroelectric memory element 110a and the first resistive memory element 120a can be changed by voltages applied through the word line WL1, bit line BL1, and source line SL1. The first memory cell 100a thereby stores an electrical signal having a plurality of levels that are distinguished from each other according to the resistance states of the first ferroelectric memory element 110a and the first resistive memory element 120a. In other words, the memory cell 100a may store a multi-level signal with more than two levels.

Figure 2:
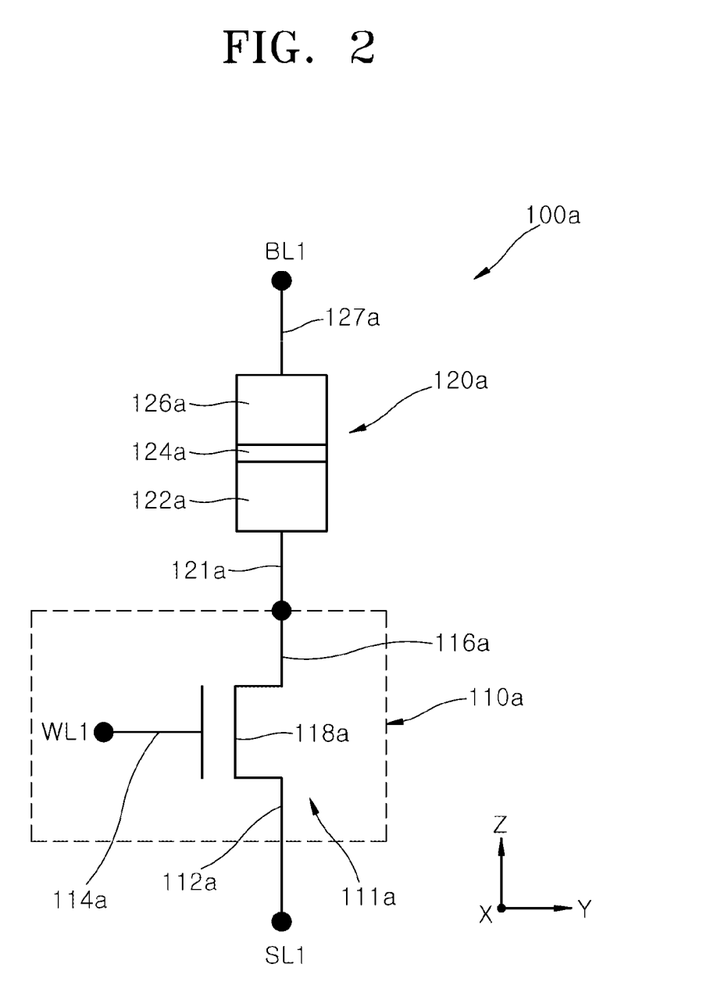
FIG. 2 is a view illustrating a memory cell of a nonvolatile memory device according to an embodiment of the present disclosure.

FIG. 2 is a view illustrating a memory cell 100a of a nonvolatile memory device according to an embodiment of the present disclosure. The memory cell 100a of FIG. 2 may be part of the nonvolatile memory device 10 of FIG. 1.

Referring to FIG. 2, the memory cell 100a may include a ferroelectric memory element 110a and a resistive memory element 120a. The ferroelectric memory element 110a may include a field effect transistor 111a. The ferroelectric memory element 110a and the resistive memory element 120a may be electrically connected in series through a first contact wire 121a. In other words, a channel resistance of the field effect transistor 111a in the ferroelectric memory element 110a and a resistance of the resistive memory element 120a may be present in the same electrical path. That is, a total electrical resistance of the electrical path may be obtained by adding the channel resistance of the field effect transistor 111a and the resistance of the resistive memory element 120a together.

The field effect transistor 111a of the ferroelectric memory element 110a may have a ferroelectric gate dielectric layer 118a. A gate electrode 114a of the field effect transistor 111a may be connected to a word line WL1, and may be disposed on the ferroelectric gate dielectric layer 118a. A source electrode 112a and a drain electrode 116a of the field effect transistor 111a may be disposed on opposite sides of the ferroelectric gate dielectric layer 118a. The source electrode 112a may be connected to a source line SL1. The drain electrode 116a may be connected to the first contact wire 121a.

A voltage equal to or higher than a threshold voltage may be applied to the gate electrode 114a by the word line WL1. The applied voltage may change the polarization direction of the ferroelectric gate dielectric layer 118a.

The voltage that changes the polarization direction of the ferroelectric gate dielectric layer 118a is referred to as a "switching voltage of the ferroelectric memory element 110a," or a "first switching voltage." In an embodiment, the first switching voltage may change the polarization direction of the ferroelectric gate dielectric layer 118a according to the polarity of the first switching voltage. That is, the first switching voltage may be applied to the ferroelectric gate dielectric layer 118a with the same magnitude and with different polarities.

When the polarization direction of the ferroelectric gate dielectric layer 118a is changed by the first switching voltage, a channel resistance under the ferroelectric gate dielectric layer 118a may be changed. The channel resistance corresponds to an electrical resistance of the ferroelectric memory element 110a.

For example, the first switching voltage may be applied so that a bias voltage having a positive polarity is applied to the gate electrode 114a. In this case, the polarization direction of the ferroelectric gate dielectric layer 118a may be determined so that negative charges can be distributed in a channel region under the ferroelectric gate dielectric layer 118a. As a result, when the field effect transistor 111a is turned on, the resistance to electrons moving in the channel region, that is, the channel resistance, can be reduced. In other words, the channel resistance changes to a low resistance state when a voltage applied to the gate electrode 114a corresponds to the first switching voltage with a positive polarity.

In another example, the first switching voltage may be applied so that a bias voltage having a negative polarity is applied to the gate electrode 114a. In this case, the polarization direction of the ferroelectric gate dielectric layer 118a may be determined so that positive charges can be distributed in the channel region under the ferroelectric gate dielectric layer 118a. As a result, when the field effect transistor 111a is turned on, the resistance to the electrons moving in the channel region, that is, the channel resistance, can be increased. In other words, the channel resistance changes to a high resistance state when a voltage applied to the gate electrode 114a corresponds to the first switching voltage with a negative polarity.

Even after the first switching voltage is removed, the ferroelectric gate dielectric layer 118a can maintain the polarization direction caused by the first switching voltage. Accordingly, an electrical signal can be non-volatilely stored in the field effect transistor 111a according to whether the channel resistance is in the low resistance state or the high resistance state.

In addition, depending on the polarity of the applied switching voltage, the channel resistance of the field effect transistor 111a can be reversibly changed. As a result, the field effect transistor 111a can non-volatilely store an electrical signal with at least two different levels respectively corresponding to at least two different channel resistance states of the field effect transistor 111a. The at least two electrical signal levels are distinguished from each other.

The internal resistance of the resistive memory element 120a can be variably changed depending on the size or polarity of the externally applied voltage. As a result, the resistive element 120a can non-volatilely store an electrical signal with at least two different levels respectively. The resistive element 120a may include, for example, a magnetic memory element, a phase change memory element, or a resistance change memory element. Hereinafter, in an embodiment of the present disclosure, the resistive memory element 120a may be described as a magnetic memory element 120a as an example, but embodiments are not limited thereto. In some other embodiments not illustrated, a phase change memory element or a resistance change memory element may be applied as the resistive memory element 120a.

In an embodiment, the magnetic memory element 120a may include a free layer 122a, a tunnel barrier layer 124a, and a fixed layer 126a, which are sequentially stacked. The magnetic memory element 120a may, for example, be a spin transfer torque RAM. The free layer 122a may have a variable magnetization direction. The free layer 122a may include a ferroelectric metal, a ferroelectric oxide, or both. The free layer 122a may be connected to the drain electrode 116a of the field effect transistor 111a through the first contact wire 121a. The fixed layer 126a may have a fixed magnetization direction. The fixed layer 126a may be connected to a bit line BL1 through a second contact wire 127a. Each of the free layer and the fixed layer may include at least one of iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), and cobalt-platinum (CoPt).

When a voltage that is equal to or higher than a threshold voltage is applied to the magnetic memory element 120a, the magnetization direction of the free layer 122a may be changed. The voltage that changes the magnetization direction of the free layer 122a is referred to as a "switching voltage of the magnetic memory element 120a" or a "second switching voltage." In an embodiment, the second switching voltage may be applied to the magnetic memory element 120a (that is, between the free layer 122a and the fixed layer 126a), with different polarities. The magnetization direction of the free layer 122a may be changed according to the polarity of the second switching voltage applied between the free layer 122a and the fixed layer 126a.

In an embodiment, when the second switching voltage of a first polarity is applied, such that an electron flow is generated from the fixed layer 126a to the free layer 122a via the tunnel barrier layer 124a, the magnetization direction of electrons of the free layer 122a may be changed to a direction aligned with a magnetization direction in the fixed layer 126a. As a result, the electrical resistance of the magnetic memory element 120a, that is, the magnetic resistance, may be lowered. That is, the magnetic resistance changes to a low resistance state when a voltage corresponding to the second switching voltage with the first polarity is applied to the magnetic memory element 120a.

In contrast, when the second switching voltage of a second polarity is applied, such that an electron flow is generated from the free layer 122a to the fixed layer 126a via the tunnel barrier layer 124a, the magnetization direction of the free layer 122a may be changed to a direction opposite to the magnetization direction of the fixed layer 126a. As a result, the electrical resistance of the magnetic memory element 120a, that is, the magnetic resistance, may be raised. That is, the magnetic resistance changes to a high resistance state when a voltage corresponding to the second switching voltage with the second polarity is applied to the magnetic memory element 120a.

Even after the second switching voltage applied to the magnetic memory element 120a is removed, the magnetic memory element 120a can maintain the polarization state caused by the second switching voltage. Accordingly, the magnetic memory element 120a can non-volatilely store an electrical signal with at least two different levels, respectively corresponding to the low resistance state and the high resistance state. In addition, depending on the polarity of the applied second switching voltage, the magnetic resistance of the magnetic memory element 120a can be reversibly changed. As a result, the magnetic memory element 120a can non-volatilely store an electrical signal with different levels respectively corresponding to the magnetic resistance states of the magnetic memory element 120a, which are distinguished from each other.

In an embodiment of the present disclosure, the drain electrode 116a of the field effect transistor 111a and the free layer 122a of the magnetic memory element 120a may be electrically connected in series through the first contact wire 121a. Accordingly, an internal circuit of the memory cell 100a may have a configuration in which the channel resistance of the field effect transistor 111a and the magnetic resistance of the magnetic memory element 120a are present in the same electrical path. In other words, a total resistance of the memory cell 100a corresponds to a sum of the channel resistance and the magnetic resistance.

In an embodiment, the channel resistance of the field effect transistor 111a may be in a first channel resistance state or a second channel resistance state. Meanwhile, the magnetic resistance of the magnetic memory element 120a may be in a first magnetic resistance state or a second magnetic resistance state. The first and second channel resistance states may have different resistance values than each other, and may have different resistance values than the first and second magnetic resistance states.

In addition, the absolute value of the first switching voltage of the field effect transistor 111a may be different from the absolute value of the second switching voltage of the magnetic memory element 120a. For example, the absolute value of the first switching voltage of the field effect transistor 111a may be greater than the absolute value of the second switching voltage of the magnetic memory element 120a. As a result, write operations for the field effect transistor 111a and the magnetic memory element 120a may be performed individually and sequentially. Accordingly, the write operations can be used to implement four different resistance levels of the memory cell 100a, in which the channel resistance and the magnetic resistance are present in the same electrical path. As a result, a multi-level signal can be stored in the memory cell 100a using the different ferroelectric resistance states of the ferroelectric memory element 110a and the different magnetic resistance states of the magnetic memory element 120a.

Although, in FIG. 2 of the present embodiment, the source electrode 112a is connected to the source line SL1 and the drain electrode 116a is connected to the first contact wire 121a, embodiments are not limited thereto. In some other embodiments, the positions of the source electrode 112a and the drain electrode 116a of the field effect transistor 111a may be exchanged with each other as needed.

In addition, although FIG. 2 illustrates that the free layer 122a of the magnetic memory element 120a is connected to the first contact wire 121a and the fixed layer 126a of the magnetic memory element 120a is connected to the second contact wire 127a, embodiments are not limited thereto. In some other embodiments, the positions of the free layer 122a and the fixed layer 126a of the magnetic memory element 120a may be exchanged with each other as needed. That is, the free layer 122a of the magnetic memory element 120a is connected to the second contact wire 127a and the fixed layer 126a of the magnetic memory element 120a is connected to the first contact wire 121a.

In some other embodiments, when the resistive memory element 120a is a phase change memory element, the phase change memory element 120a may include a pair of electrode layers and a phase change layer disposed between the electrode layers. When a predetermined switching voltage is applied to the phase change memory element 120a, joule heating by a current supplied to the phase change layer may cause a resistance state of the phase change layer to be switched to a crystalline state having a relatively low resistance or an amorphous state having a relatively high resistance.

Even after the switching voltage applied to the phase change memory element 120a is removed, the phase change memory element 120a can maintain the switched crystalline state caused by the switching voltage. Accordingly, the phase change memory element 120a can maintain different resistance states. As described above, any one of the pair of electrode layers of the phase change memory element 120a is electrically connected in series with the drain electrode of the ferroelectric memory element 110a so that at least two different levels based on a plurality of resistance states can be implemented to the memory cell 100a.

In some other embodiments, when the resistive memory element 120a is a resistance change memory element, the resistance change memory element 120a may include a pair of electrode layers and a resistance change layer disposed between the pair of electrode layers. When a predetermined switching voltage is applied to the resistance change memory element 120a, the resistance change layer can be switched to a relatively low resistance state or a relatively high resistance state by any of various known switching methods.

Even after the switching voltage applied to the resistance change memory element 120a is removed, the resistance change memory element 120a can maintain the switched resistance state. Accordingly, the resistance change memory element 120a can maintain different resistance states. As described above, any one of the pair of electrode layers of the resistance change memory element 120a is electrically connected in series with the drain electrode of the ferroelectric memory element 110a so that at least two different levels based on a plurality of resistance states can be implemented to the memory cell 100a.

Figure 3:
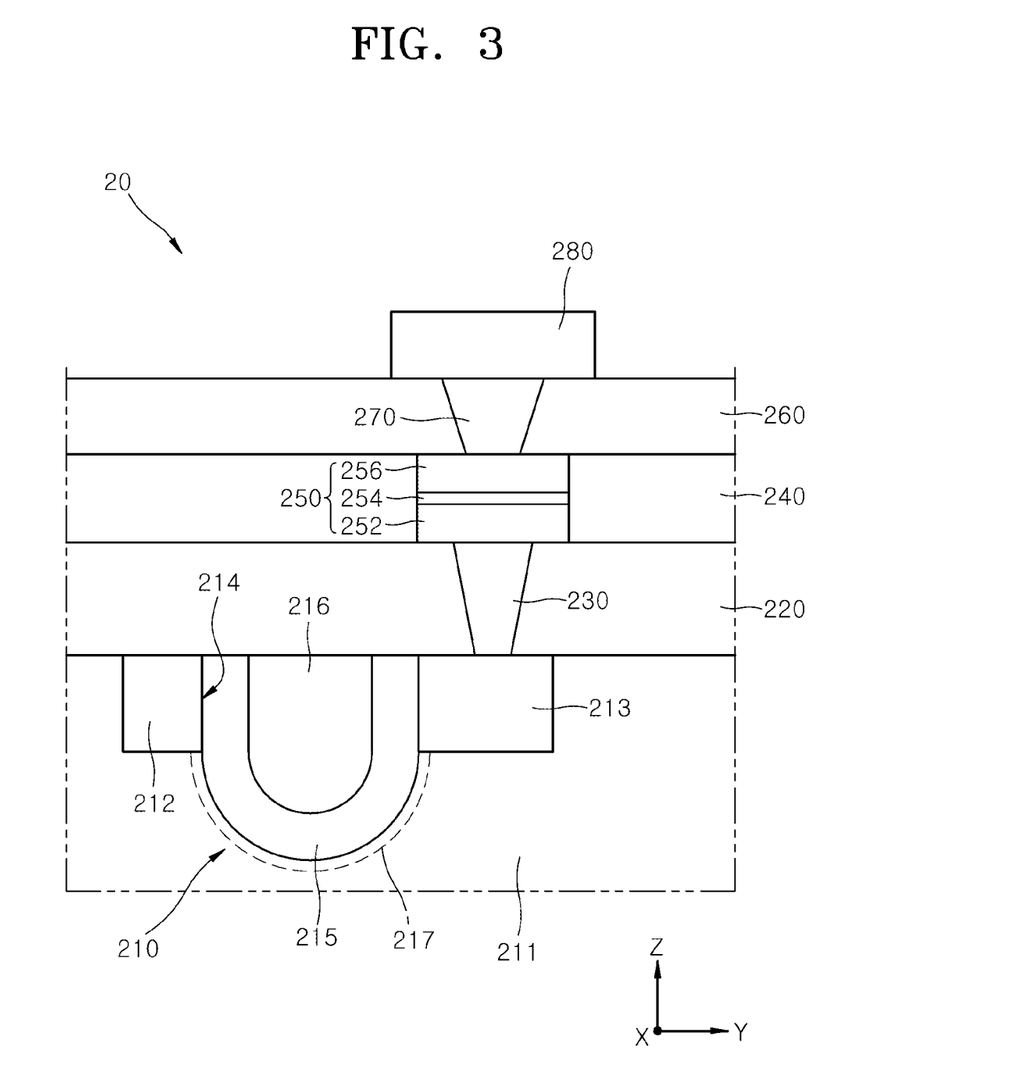
FIG. 3 is a cross-sectional view illustrating a memory cell of a nonvolatile memory device according to an embodiment of the present disclosure.

FIG. 3 is a cross-sectional view illustrating a memory cell 20 of a nonvolatile memory device according to an embodiment of the present disclosure. Referring to FIG. 3, the memory cell 20 may include a ferroelectric memory element 210 and a resistive memory element 250. The memory cell 20 may have the same configuration as each of the memory cells 100a, 100b, 100c, and 100d described above with reference to FIGS. 1 and 2. In this embodiment, a magnetic memory element will be described as the resistive memory element 250.

Referring to FIG. 3, a semiconductor substrate 211 may be provided. The semiconductor substrate 211 may, for example, be a silicon (Si) substrate or a germanium (Ge) substrate. In another example, the semiconductor substrate 211 may be a compound semiconductor substrate such as a gallium arsenide (GaAs) substrate. The semiconductor substrate 211 may, for example, be a substrate doped with p-type dopants.

A trench 214 may be formed in the semiconductor substrate 211 from a surface of the semiconductor substrate 211. A ferroelectric gate dielectric layer 215 may be disposed along an inner wall of the trench 214. The ferroelectric gate dielectric layer 215 may, for example, include hafnium oxide, zirconium oxide, titanium oxide, or an oxide of a combination of two or more of hafnium, zirconium, and titanium. The ferroelectric gate dielectric layer 215 may include a dopant such as, for example, yttrium (Y), zirconium (Zr), magnesium (Mg), silicon (Si), barium (Ba), or a combination of two or more of Y, Zr, Mg, Si, and Ba. The dopant may be distributed in the oxide.

A gate electrode layer 216 may be disposed on the ferroelectric gate dielectric layer 215, which is formed along the inner wall of the trench 214. The gate electrode layer 216 may, for example, include a metal such as tungsten (W), titanium (Ti), copper (Cu), or the like. In another example, the gate electrode layer 216 may include a metal nitride such as tungsten nitride (WN), titanium nitride (TiN), tantalum nitride (TaN), or the like. In yet another example, the gate electrode layer 216 may include a conductive metal carbide, or a conductive metal silicide. The gate electrode layer 216 may be connected to a word line (not illustrated). In the embodiment of FIG. 3, the gate electrode layer 216 is formed to fill the remaining portion of the trench 214 after the ferroelectric gate dielectric layer 215 is formed along the inner wall of the trench 214.

A source electrode region 212 and a drain electrode region 213 may be spaced apart from each other on opposite sides of the trench 214. The source electrode region 212 and the drain electrode region 213 may be formed by doping the semiconductor substrate 211 with dopants. The source electrode region 212 may be connected to a source line (not illustrated). In an embodiment in which the semiconductor substrate 211 is doped with p-type dopants, the source electrode region 212 and the drain electrode region 213 may be formed by doping the semiconductor substrate 211 with n-type dopants.

As described above, a buried field effect transistor can be formed, which includes the ferroelectric gate dielectric layer 215 and the gate electrode layer 216 buried in the semiconductor substrate 211. The buried field effect transistor may constitute the ferroelectric memory element 210 of the memory cell 20. That is, the ferroelectric memory element 210 may include the buried field effect transistor.

In the buried field effect transistor, the polarization direction of the ferroelectric gate dielectric layer 215 may be changed depending on a polarity of a first switching voltage applied to the gate electrode layer 216. As a result, a channel resistance of a channel region 217, which is disposed under the ferroelectric gate dielectric layer 215 in the substrate 211, can be changed.

In an embodiment, if the polarity of the first switching voltage is positive, negative charges may be concentrated in the channel region 217. Accordingly, when electrons move through the channel region 217 as charge carriers, the channel resistance may exhibit a relatively low resistance state. If the polarity of the first switching voltage is negative, negative charges may be eliminated or positive charges may be concentrated in the channel region 217. Accordingly, when electrons move through the channel region 217 as charge carriers, the channel resistance may exhibit a relatively high resistance state.

Referring to FIG. 3 again, a first interlayer insulating layer 220 may be disposed on the ferroelectric memory element 210. A magnetic memory element 250 may be disposed on the first interlayer insulating layer 220.

The magnetic memory element 250 may include a free layer 252, a tunnel barrier layer 254, and a fixed layer 256 that are sequentially stacked. The free layer 252 may be connected to the drain electrode region 213 through a first contact wire 230. The first contact wire 230 may be a via penetrating the first interlayer insulating layer 220. The first contact wire 230 may, for example, include a conductive material such as tungsten (W), tungsten nitride (WN), titanium (Ti), titanium nitride (TiN), copper (Gu), aluminum (Al), or the like.

The magnetic memory element 250 may, for example, be a spin transfer torque RAM. For example, the free layer 252, the tunnel barrier layer 254, and the fixed layer 256 may constitute a part of a vertical type magnetic tunnel junction (p-MTJ).

The free layer 252 may have a changeable magnetization direction. The free layer 252 may, for example, include a ferroelectric material such as iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), cobalt-platinum (CoPt), or the like.

The tunnel barrier layer 254 may be disposed between the free layer 252 and the fixed layer 256. The tunnel barrier layer 254 may, for example, include magnesium oxide (MgO), aluminum oxide (Al2O3), or the like.

The fixed layer 256 may have a fixed magnetization direction. The fixed layer 256 may, for example, include a ferroelectric material such as iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), cobalt-platinum (CoPt), or the like. The fixed layer 256 may include a single layer or double layers. In an embodiment, the fixed layer 256 may have a synthetic anti-ferromagnetic (SAF) structure.

The magnetic memory element 250 may be separated from a surrounding environment by a second interlayer insulating layer 240. That is, the magnetic memory element 250 may be disposed through the second interlayer insulating layer 240.

A third interlayer insulating layer 260 may be disposed on the magnetic memory element 250. A bit line 280 may be disposed on the third interlayer insulating layer 260. The bit line 280 may be electrically connected to the fixed layer 256 of the magnetic memory element 250 through a second contact wire 270. The second contact wire 270 may be a via penetrating the third interlayer insulating layer 260. The second contact wire 270 may, for example, include a conductive material such as tungsten (W), tungsten nitride (WN), titanium (Ti), titanium nitride (TiN), copper (Gu), aluminum (Al), or the like.

The magnetic memory element 250 may be operated as follows. In an embodiment, when a second switching voltage having a first polarity is applied to the magnetic memory element 250, such that an electron flow is generated from the fixed layer 256 to the free layer 252 via the tunnel barrier layer 254, a magnetization direction of the free layer 252 may become aligned with a magnetization direction of the fixed layer 256. As a result, the electrical resistance of the magnetic memory element 250, that is, the magnetic resistance, may be reduced. In other words, the magnetic resistance may be changed to a low resistance state when the second switching voltage is applied with the first polarity.

In contrast, when the second switching voltage having a second polarity is applied, such that an electron flow is generated from the free layer 252 to the fixed layer 256 via the tunnel barrier layer 254, the magnetization direction of the free layer 252 may become opposite to the magnetization direction of the fixed layer 256. As a result, the electrical resistance of the magnetic memory element 250, that is, the magnetic resistance, may be raised. In other words, the magnetic resistance may be changed to a high resistance state when the second switching voltage is applied with the second polarity.

As described above, the memory cell 20 may include the ferroelectric memory element 210 and the magnetic memory element 250. The ferroelectric memory element 210 may include a field effect transistor buried in the semiconductor substrate 211. The magnetic memory element 250 may be connected to the drain electrode region 213 of the buried field effect transistor in series.

The memory cell 20 may have a circuit configuration in which the ferroelectric memory element 210 and the magnetic memory element 250 are connected in series. Since the electrical resistance of the ferroelectric memory element 210 is the channel resistance, and the electrical resistance of the magnetic memory element 250 is the magnetic resistance, a total resistance of the memory cell 20 corresponds to a sum of the channel resistance and the magnetic resistance. The polarization direction of the ferroelectric gate dielectric layer 215 may be controlled by the polarity of the first switching voltage when the first switching voltage is applied to the gate electrode layer 216, and the magnetization direction of the free layer 252 may be controlled by the polarity of the second switching voltage when the second switching voltage is applied between the free layer 252 and the fixed layer 256. As described above, it is possible to write different electrical signal levels in the memory cell 20 by separately controlling the channel resistance and the magnetic resistance.

Although FIG. 3 illustrates the source electrode region 212 connected to the source line, and the drain electrode region 213 connected to the first contact wire 230, embodiments are not limited thereto. In some other embodiments, the positions of the source electrode region 212 and the drain electrode region 213 can be exchanged with each other as needed.

Although FIG. 3 illustrates the free layer 252 connected to the first contact wire 230 and the fixed layer 256 connected to the second contact wire 270, embodiments are not limited thereto. In some other embodiments, the positions of the free layer 252 and the fixed layer 256 of the magnetic memory element 250 can be exchanged with each other as needed.

Figure 4:
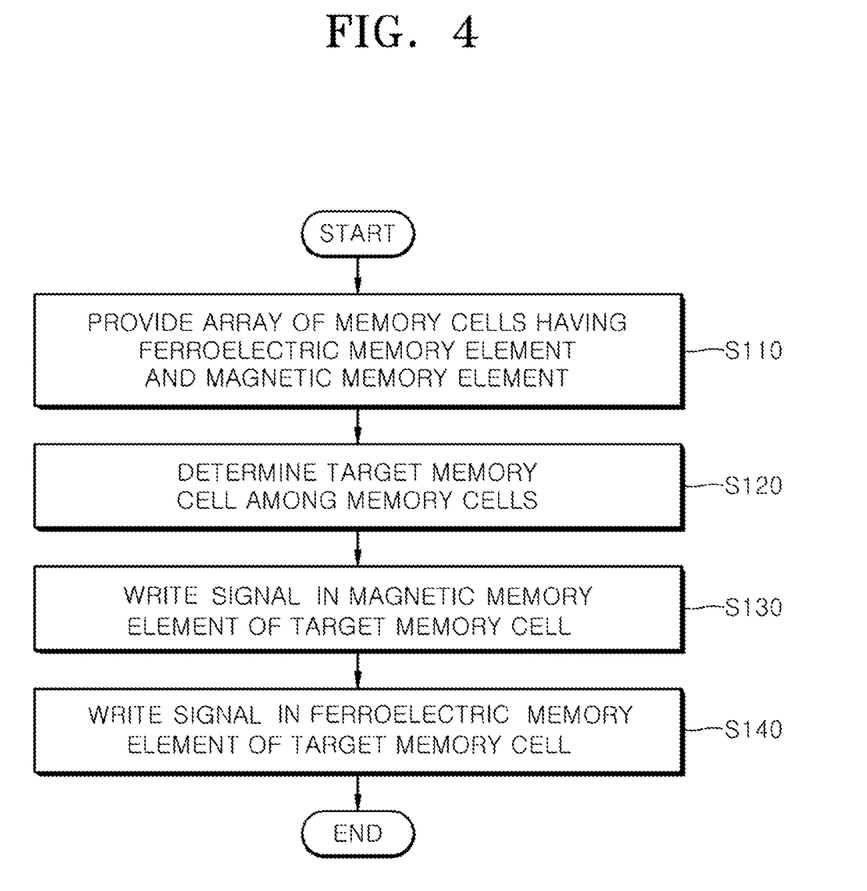
FIG. 4 is a flow chart illustrating a method of writing a signal in a nonvolatile memory device according to an embodiment of the present disclosure.

FIG. 4 is a flow chart illustrating a method of writing a signal in a nonvolatile memory device according to an embodiment of the present disclosure. The method of writing a signal in a nonvolatile memory device of FIG. 4 may be used to write a signal in the memory device 10 described above with reference to FIGS. 1 and 2, and to write a signal in the memory cell 20 described above with reference to FIG. 3.

Referring to operation S110 of FIG. 4, a memory cell array including a plurality of memory cells may be provided. Each of the plurality of memory cells may include a ferroelectric memory element and a resistive memory element. In an embodiment, the resistive memory element may be a magnetic memory element. In an embodiment, the ferroelectric memory element may include a field effect transistor having a ferroelectric gate dielectric layer. The magnetic memory element may have a free layer, a tunnel barrier layer, and a fixed layer, which are sequentially stacked. A drain electrode of the field effect transistor may be electrically connected to one of the free layer and the fixed layer in series.

Referring to operation S120, a target memory cell may be determined among the plurality of memory cells in the memory cell array. In an embodiment, the target memory cell may be selected using a control signal of a control circuit connected to the memory cell array.

Referring to operation S130, a signal may be written in the resistive memory element of the target memory cell. In an embodiment, when the resistive memory element is the magnetic memory element, the signal may be written in the magnetic memory element by changing a magnetic resistance of the magnetic memory element of the target memory cell. In an embodiment, a second switching voltage may be applied between the free layer and the fixed layer of the magnetic memory element to change the magnetization direction of the free layer, thereby changing a magnetic resistance in the target cell. In an embodiment, the magnetic resistance may have a first magnetic resistance state or a second magnetic resistance according to a polarity of the second switching voltage applied to between the free layer and the fixed layer of the magnetic memory element. The first magnetic resistance state and the second magnetic resistance state may be different from each other.

Referring to operation S140, a signal may be written in the ferroelectric memory element of the target memory cell by changing a channel resistance of the ferroelectric memory element of the target memory cell. In an embodiment, the signal may be written in the target memory cell by applying a first switching voltage to a gate electrode of the field effect transistor. In an embodiment, the channel resistance may have a first channel resistance state or a second channel resistance state according to a polarity of the first switching voltage applied to the gate electrode. The first and second channel resistance states may be different from each other.

Meanwhile, in an embodiment of the present disclosure, the first and second magnetic resistance states and the first and second channel resistance states may have different resistance values. Accordingly, a total resistance of the target memory cell may have one of four different resistance levels, and a signal corresponding to the total resistance of the target memory cell can be written in the target memory cell. As a result, according to the embodiments of the present disclosure, it is possible to store a multi-level signal in a nonvolatile memory device.

Figure 5:
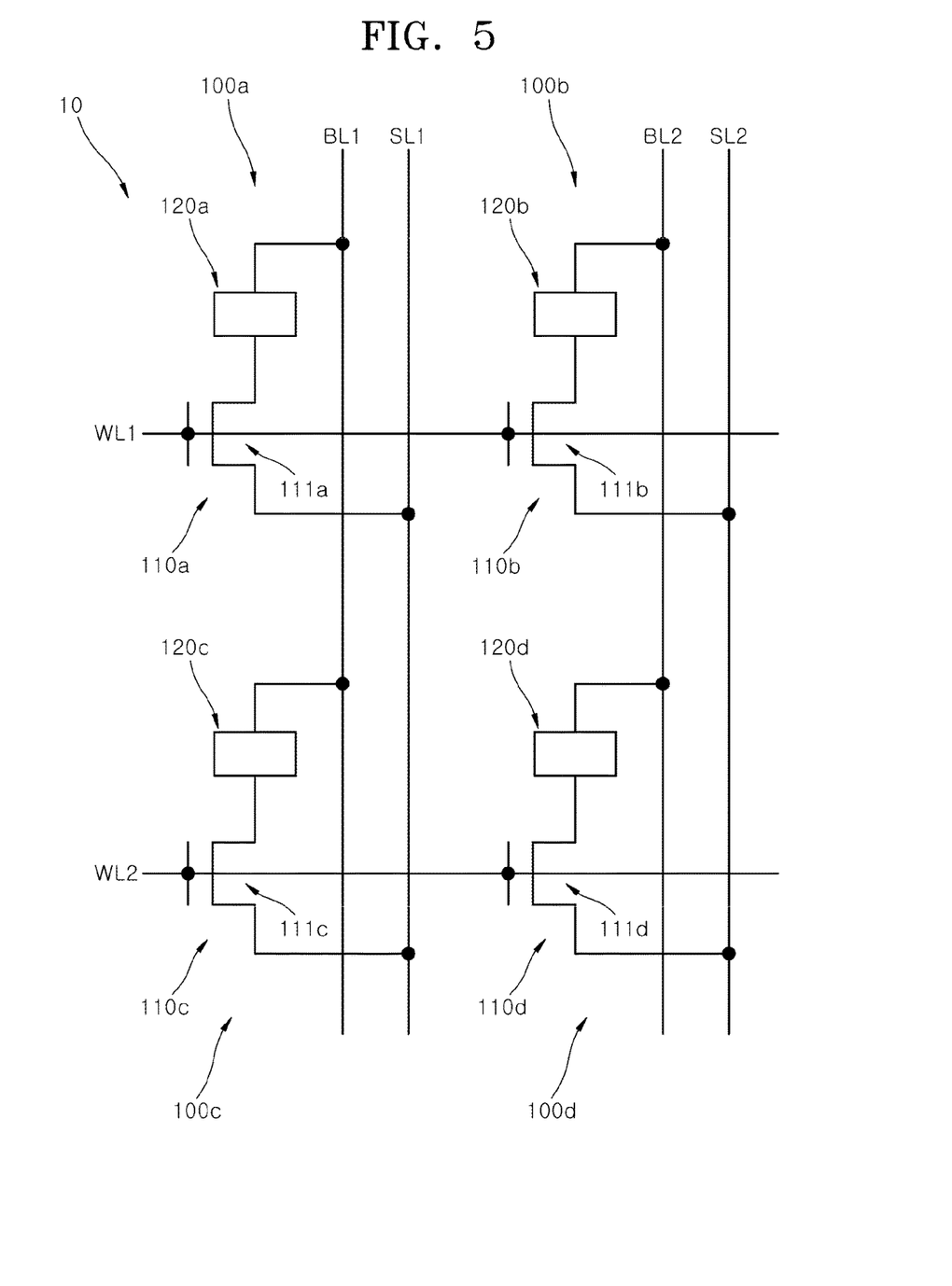
FIG. 5 is a circuit diagram illustrating a method of writing a signal in a nonvolatile memory device according to an embodiment of the present disclosure.

FIG. 5 is a circuit diagram illustrating a method of writing a signal in a nonvolatile memory device 10 according to an embodiment of the present disclosure.

Referring to FIG. 5, the nonvolatile memory device 10 has an array including a plurality of memory cells 100a, 100b, 100c, and 100d. The nonvolatile memory device 10 of FIG. 5 may be the same as or similar to the nonvolatile memory device 10 described above with reference to FIGS. 1 and 2. Hereinafter, in an embodiment, a magnetic memory element may be applied as the resistive memory element of the nonvolatile memory device 10.

In the method of writing an electrical signal in the nonvolatile memory device 10, a target memory cell may be determined among the memory cells 100a, 100b, 100c, and 100d. Hereinafter, for the convenience of explanation, the first memory cell 100a is selected as the target memory cell. The first memory cell 100a may include a first ferroelectric memory element 110a and a first magnetic memory element 120a. The first ferroelectric memory element 110a may include a first field effect transistor 111a. A gate electrode of the first field effect transistor 111a may be connected to a first word line WL1 and a source electrode of the first field effect transistor 111a may be connected to a first source line SL1. A first end of the magnetic memory element 120a may be connected to a first bit line BL1 and a second end of the magnetic memory element 120a may be connected to a drain electrode of the first field effect transistor 111a.

The following Table 1 is a table describing operating conditions for storing different levels of an electrical signal in the target memory cell of the nonvolatile memory device 10 in accordance with an embodiment of the present disclosure.

TABLE 1

| Writing data | Writing operation | WL1 voltage | BL1 voltage | SL1 voltage | WL2 voltage | BL2 voltage | SL2 voltage |
|---|---|---|---|---|---|---|---|
| 00 | First step | V/2 | 0 | V/2 | 0 | 0 | 0 |
|  | Second step | V | 0 | 0 | V/2 | 0 | V/2 |
| 01 | First step | V/2 | 0 | V/2 | 0 | 0 | 0 |
|  | Second step | −V | 0 | 0 | −V/2 | 0 | −V/2 |
| 10 | First step | V/2 | V/2 | 0 | 0 | 0 | 0 |
|  | Second step | V | 0 | 0 | V/2 | 0 | V/2 |
| 11 | First step | V/2 | V/2 | 0 | 0 | 0 | 0 |
|  | Second step | −V | 0 | 0 | −V/2 | 0 | −V/2 |

According to an embodiment of the present disclosure, an electrical signal, which can have one of four different levels, can be stored in the first memory cell 100a that is the target memory cell. For example, as shown in Table 1, the electrical signal levels may be represented by any of '00,' '01,' '10,' and '11.'. The first memory cell 100a stores an electrical signal with a first level of '00' when the channel resistance of the first ferroelectric memory element 110a is in a low resistance state and the magnetic resistance of the first magnetic memory element 120a is in a low resistance state. The first memory cell 100a stores an electrical signal with a second level of '01' when the channel resistance of the first ferroelectric memory element 110a is in the low resistance state and the magnetic resistance of the first magnetic memory element 120a is in a high resistance state. The first memory cell 100a stores an electrical signal with a third level of '10' when the channel resistance of the first ferroelectric memory element 110a is in a high resistance state and the magnetic resistance of the first magnetic memory element 120a is in the low resistance state. The first memory cell 100a stores an electrical signal with a fourth level of '11' when the channel resistance of the first ferroelectric memory element 110a is in the high resistance state and the magnetic resistance of the first magnetic memory element 120a is in the high resistance state.

In an embodiment, an operation of writing an electrical signal in the selected first memory cell 100a may include a first step of writing a signal in the first magnetic memory element 120a by changing a magnetic resistance of the first magnetic memory element 120a, and a second step of writing a signal in the first ferroelectric memory element 110a by changing a channel resistance of the first ferroelectric memory element 100a. The first and second steps may be performed sequentially.

In the first step, a switching voltage to change the magnetic resistance of the first magnetic memory element 120a may be V/2. In the second step, a switching voltage with a magnitude equal to V or −V may be applied to the gate electrode of the first ferroelectric memory element 110a to change the channel resistance of the first ferroelectric memory element 110a. Here, V represents a positive number. In other words, a first switching voltage may have an absolute value equal to V, and the second switching voltage may have an absolute value equal to V/2. Accordingly, an absolute value of the first switching voltage may be greater than an absolute value of the second switching voltage.

In addition, the field effect transistor in the first ferroelectric memory element 110a can be turned on at a gate voltage lower than V, irrespective of the channel resistance write operation. In an embodiment, the field effect transistor can be turned on when the voltage applied to the gate electrode is V/2 or more. When the field effect transistor is turned on, a channel current can flow through the field effect transistor depending on the voltage applied between the drain electrode and the source electrode.

In an embodiment described below, an absolute value of the first switching voltage of the first ferroelectric memory element 110a is V, and an absolute value of the second switching voltage of the first magnetic memory element 120a is V/2, but embodiments are not limited thereto. Various modifications are possible as long as the first switching voltage applied to the first ferroelectric memory element 110a and the second switching voltage applied to the first magnetic memory element 120a can be distinguished from each other. That is, the first and second switching voltages may be different from each other.

First, an operation of writing an electrical signal with a first level of '00' in the first memory cell 100a may proceed as follows.

Referring to FIG. 5 and Table 1, in the first step, a voltage of V/2 is applied to the first word line WL1, a voltage of zero is applied to the first bit line BL1, and a voltage of V/2 is applied to the first source line SL1. A voltage of zero is applied to each of a second word line WL2, a second bit line BL2, and a second source line SL2, respectively.

Accordingly, the first field effect transistor 111a of the first ferroelectric memory element 110a is turned on by the voltage of V/2 being applied to the first word line WL1. In addition, a voltage of V/2 applied between the first bit line BL1 and the first source line SL1 is also applied to the first magnetic memory element 120a. Since an electron flow occurs from the fixed layer 126a toward the free layer 122a of the first magnetic memory element 120a in the first step, the magnetization direction of the free layer 122a is changed to coincide with the magnetization direction of the fixed layer 126a. As a result, a signal corresponding to a low resistance state is written in the first magnetic memory element 120a.

Meanwhile, with respect to the second memory cell 100b during the first step, although a second field effect transistor 111b is turned on by the voltage of V/2 applied to the first word line WL1, a voltage difference between the second bit line BL2 and the second source line SL2 does not occur, such that a write operation is not performed on the second magnetic memory element 120b of the second memory cell 100b. With respect to the third and fourth memory cells 100c and 100d during the first step, because a voltage of zero is applied to the second word line WL2, the third and fourth field effect transistors 111c and 111d are not turned on, such that a write operation is not performed on either of the third or fourth magnetic memory elements 120c and 120d.

The second step is performed sequentially with respect to the first step. In the second step, a voltage of V is applied to the first word line WL1, a voltage of zero is applied to the first bit line BL1, a voltage of zero is applied to the first source line SL1, a voltage of V/2 is applied to the second word line WL2, a voltage of zero is applied to the second bit line BL2, and a voltage of V/2 is applied to the second source line SL2.

When the voltage of V is applied to the first word line WL1, the applied voltage of V acts as the first switching voltage, and the ferroelectric gate dielectric layer of the first field effect transistor 111a may be polarized. In accordance with this, negative charges can be concentrated in the channel region under the ferroelectric gate dielectric layer. As a result, a channel resistance of the channel region can change to a low resistance state.

Meanwhile, during the second step, no voltage difference occurs across the first magnetic memory element 120a of the first memory cell 100a. Therefore, the write operation for the first magnetic memory element 120a may not occur.

In addition, with respect to the second memory cell 100b, the voltage of V is applied through the first word line WL1 as the voltage of V/2 is applied to the second source line SL2, and thus, a voltage applied to the gate electrode of the second field effect transistor 111b becomes lower than the first switching voltage of V. Therefore, the write operation may not be performed in the channel region of the second field effect transistor 111b.

Similarly, with respect to the third and fourth memory cells 100c and 100d, since a voltage of V/2 and a voltage of zero are applied to the first source line SL1 and the second source line SL2, respectively, a voltage applied to a gate electrode of each of the third and fourth effect transistors 111c and 111d becomes lower than the first switching voltage of V. Therefore, the write operations may not be performed in the channel regions of the third and fourth field effect transistors 111c and 111d.

The second step does not proceed during the first step, and the first step does not proceed during the second step. That is, the first step is performed before or after the second step. In other words, the first step and the second step for the first memory cell 100a may be performed sequentially and during different time periods.

As a result, by applying the operations of the first and second steps as described above, the magnetic resistance of the first magnetic memory element 120a may be changed to a low resistance state, and the channel resistance of the first field effect transistor 111a may be changed to a low resistance state, such that the electrical signal corresponding to the first level of '00' may be written in the first memory cell 100a.

An operation for writing an electrical signal with the second level of '01' in the first memory cell 100a may proceed as follows. Referring to FIG. 5 and Table 1, in a first step, a voltage of V/2 is applied to the first word line WL1, a voltage of zero is applied to the first bit line BL1, and a voltage of V/2 is applied to the first source line SL1. A voltage of zero is applied to the second word line WL2, the second bit line BL2, and the second source line SL2.

Accordingly, similar to the operation for writing the electrical signal of '00' described above, a magnetic resistance of the first magnetic resistance element 120a may change to a low resistance state.

A second step proceeds sequentially with respect to the first step. In the second step, a voltage of −V is applied to the word line WL1, a voltage of zero is applied to the first bit line BL1, and a voltage of zero is applied to the first source line SL1. Further, a voltage of −V/2 is applied to the second word line WL2, a voltage of zero is applied to the second bit line BL2, and a voltage of −V/2 is applied to the second source line SL2.

When the voltage of −V is applied to the first word line WL1, the applied voltage acts as the first switching voltage, and the ferroelectric gate dielectric layer of the first field effect transistor 111a may be polarized in a direction that negative charges are eliminated or positive charges are concentrated in the channel region under the ferroelectric gate dielectric layer. As a result, a channel resistance of the channel region may change to a high resistance state.

Meanwhile, during the second step, no voltage difference occurs across the first magnetic memory element 120a of the first memory cell 100a. Therefore, the write operation for the first magnetic memory element 120a may not occur.

In addition, although the voltage of −V is applied to the second memory cell 100b through the first word line WL1 during the second step, since the voltage of −V/2 is applied to the second source line SL2, the voltage applied to the ferroelectric dielectric layer of the second field effect transistor 111b has a lower absolute value than the first switching voltage of V. Accordingly, the write operation may not proceed in the channel region of the second field effect transistor 111b.

Similarly, with respect to the third and fourth memory cells 100c and 100d, since the voltage of −V/2 is applied to the second word line WL2, and voltages of zero and −V/2 are applied to the first source line SL1 and the second source line SL2, respectively, the write operations in the channel regions of the third and fourth field effect transistors 111c and 111d may not proceed in the channel regions of the third and fourth field effect transistors 111c and 111d.

As a result, by applying the operations of the first and second steps as described above, the magnetic resistance of the first magnetic memory element 120a can change to a low resistance state and the channel resistance of the channel region of first field effect transistor 111a can change to a high resistance state. Accordingly, the electrical signal with the second level of '01' can be written in the first memory cell 100a.

An operation for writing an electrical signal with a third level of '10' in the first memory cell 100a may proceed as follows. Referring to FIG. 5 and Table 1, in a first step, a voltage of V/2 is applied to the first word line WL1, a voltage of V/2 is applied to the first bit line BL1, and a voltage of zero is applied to the first source line SL1. A voltage of zero is applied to the second word line WL2, the second bit line BL2, and the second source line SL2, respectively.

In accordance with this, the first field effect transistor 111a of the first ferroelectric memory element 110a is turned on by the voltage of V/2 applied to the first word line WL1. The voltage of V/2 applied between the first bit line BL1 and the first source line SL1 is applied to the first magnetic memory element 120a. Here, an electron flow occurs from the free layer 122a to the fixed layer 126a, such that the magnetization direction of the free layer 122a is changed to a direction that is opposite to the magnetization direction of the fixed layer 126a. As a result, a magnetic resistance of the first magnetic memory element 120a can be changed to a high resistance state.

Meanwhile, with respect to the second memory cell 100b, although the second field effect transistor 111b is turned on by the voltage of V/2 applied to the first word line WL1, no voltage difference may occur between the second bit line BL2 and the second source line SL2, and thus, the write operation for the second magnetic memory element 120b may not proceed. With respect to the third and fourth memory cells 100c and 100d, because the voltage of zero is applied to the second word line WL2, the third and fourth field effect transistors 111c and 111d are not turned on.

A second step proceeds sequentially with respect to the first step. In the second step, a voltage of V is applied to the first word line WL1, a voltage of zero is applied to the first bit line BL1, and a voltage of zero is applied to the first source line SL1. Also, a voltage of V/2 is applied to the second word line WL2, a voltage of zero is applied to the second bit line BL2, and a voltage of V/2 is applied to the second source line SL2.

The operation of this second step is substantially the same as the above-described operation of the second step for writing the electrical signal with the first level of '00.' Accordingly, a channel resistance of the first field effect transistor 100a may be changed to a low resistance state.

As a result, by applying the operations of the first and second steps as described above, the magnetic resistance of the first magnetic memory element 120a may be changed to a high resistance state, and the channel resistance of the first field effect transistor 111a can be changed to a low resistance state. Accordingly, the electrical signal with the third level of '10' can be written in the first memory cell 100a.

An operation for writing an electrical signal with a fourth level of '11' in the first memory cell 100a may proceed as follows. Referring to FIG. 5 and Table 1, in a first step, a voltage of V/2 is applied to the first word line WL1, a voltage of V/2 is applied to the first bit line BL1, and a voltage of zero is applied to the first source line SL1. A voltage of zero is applied to the second word line WL2, the second bit line BL2, and the second source line SL2, respectively. The first step of the operation for writing the electrical signal with the fourth level of '11' is substantially the same as the first step of the operation for writing the electrical signal with the second level of '10.'

A second step proceeds sequentially with respect to the first step. In the second step, a voltage of −V is applied to the first word line WL1, a voltage of zero is applied to the first bit line BL1, and a voltage of zero is applied to the first source line SL1. Also, a voltage of −V/2 is applied to the second word line WL2, a voltage of zero is applied to the second bit line BL2, and a voltage of −V/2 is applied to the second source line SL2. The second step of the operation for writing the electrical signal with the fourth level of '11' is substantially the same as the second step of the operation for writing the electrical signal with the third level of '01'.

Accordingly, through the operations of the first and second steps, a magnetic resistance of the first magnetic memory element 120a can change to a high resistance state, and a channel resistance of the channel region of the first field effect transistor 111a can change to a high resistance state. That is, the electrical signal with the fourth level of '11' can be written in the first memory cell 100a.

In conclusion, as described above, an electrical signal, corresponding to one of four different resistance levels, can be written in the selected memory cell by sequentially performing the operations of the first step and the second step.

Figure 6:
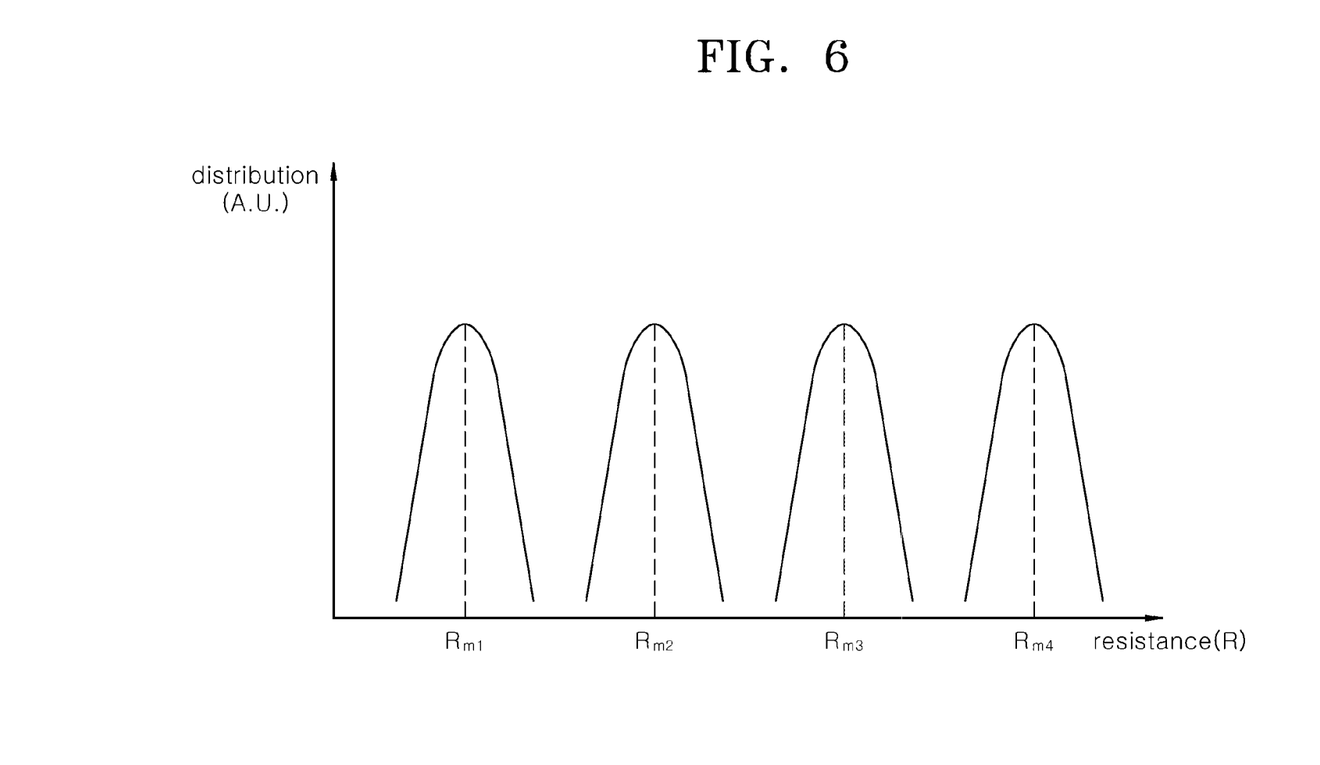
FIG. 6 is a graph illustrating multiple resistance levels of a memory cell of a nonvolatile memory device according to an embodiment of the present disclosure.

FIG. 6 is a graph illustrating a plurality of resistance levels of a memory cell of a nonvolatile memory device according to an embodiment of the present disclosure. In an embodiment, a plurality of resistance levels Rm1, Rm2, Rm3, and Rm4 may correspond to the electrical signal levels of '00,' '01,' '10,' and '11' described above with reference to FIG. 5 and Table 1.

A memory cell may include a magnetic memory element and a ferroelectric memory element. According to an embodiment of the present disclosure, the magnetic memory element, e.g., 120a, 120b, 120c, or 120d of FIG. 5, may have a magnetic resistance corresponding to a first magnetic resistance state or a second magnetic resistance state, which are different from each other. Also, the ferroelectric memory element, e.g., 110a, 110b, 110c, or 110d of FIG. 5, may have a channel resistance corresponding to a first channel resistance state or a second channel resistance state, which are different from each other. The first and second magnetic resistance states and the first and second channel resistance states may have different resistance values. Accordingly, as shown in FIG. 6, the four resistance levels Rm1, Rm2, Rm3, and Rm4 of the memory cell, in which the magnetic resistance and the channel resistance are implemented in combination, may have different values. As a result, it is possible to write an electrical signal with four levels that are distinguished from each other in a predetermined target memory cell.

Meanwhile, in an embodiment, a method of reading a memory cell in which a predetermined electrical signal is written may proceed by applying a lower voltage than a first switching voltage to a word line connected to the selected memory cell to turn on the field effect transistor, applying a lower voltage than a second switching voltage between the bit line and the source line connected to the selected memory cell, and analyzing a current detected from the memory cell to read a resistance level of the memory cell. Accordingly, the level of the electrical signal stored in the memory cell can be detected without changing a resistance level of the magnetic memory element or the ferroelectric memory element.

According to the above-described embodiments of the present disclosure, it is possible to provide a nonvolatile memory device having a memory cell that stores a multi-level signal according to different resistance states of ferroelectric memory elements and magnetic memory elements, respectively.

In addition, according to the above-described embodiments of the present disclosure, it is possible to provide a method of writing an electrical signal in a nonvolatile memory device implementing a multi-level signal by performing an operation for changing a channel resistance of a field effect transistor in the ferroelectric memory element, and an operation for changing a magnetic resistance of the magnetic memory element.

Embodiments of the present disclosure have been disclosed above for illustrative purposes. Those of ordinary skill in the art will appreciate that various modifications, additions and substitutions are possible, without departing from the scope and spirit of the disclosure, as disclosed in the accompanying claims.

What is claimed is:
1. A nonvolatile memory device comprising:
   a ferroelectric memory element including a field effect transistor, the field effect transistor having a ferroelectric gate dielectric layer and a drain electrode; and
   a resistive memory element electrically connected in series to the drain electrode of the field effect transistor,
   wherein a multi-level signal is stored in the nonvolatile memory device according to a channel resistance of the ferroelectric memory element and a resistance of the resistive memory element.
2. The nonvolatile memory device of claim 1, wherein the drain electrode is disposed on a first side of the ferroelectric gate dielectric layer,
   wherein the field effect transistor further comprises a gate electrode and a source electrode, the gate electrode being disposed on the ferroelectric gate dielectric layer and being connected to a word line, the source electrode being disposed on a second side of the ferroelectric gate dielectric layer, the second side being an opposite side of the ferroelectric gate dielectric layer to the first side, and wherein the resistive memory element comprises a magnetic memory element including a free layer, a tunnel barrier layer, and a fixed layer, which are sequentially stacked.

3. The nonvolatile memory device of claim 2, further comprising:
a first contact wire electrically connecting a first one of the free layer and the fixed layer to the drain electrode; and
a second contact wire electrically connecting a second one of the free layer and the fixed layer to a bit line.

4. The nonvolatile memory device of claim 2, wherein the channel resistance of the ferroelectric memory element has a first channel resistance state and a second channel resistance state, the first resistance state being a relatively low resistance state, the second resistance state being a relatively high resistance state,
wherein a magnetic resistance of the magnetic memory element has a first magnetic resistance state and a second magnetic resistance state, the first magnetic resistance state being a relatively low resistance state, the second magnetic resistance state being a relatively high resistance state, and
wherein the nonvolatile memory device has four different resistance levels according to the channel resistance and the magnetic resistance, which are separately controlled.

5. The nonvolatile memory device of claim 4, wherein the magnetic resistance of the magnetic memory element and the channel resistance of the ferroelectric memory element are controlled sequentially.

6. The nonvolatile memory device of claim 4, wherein the channel resistance of the ferroelectric memory element is changed when a first switching voltage is applied to the ferroelectric memory element, and a magnetic resistance of the magnetic memory element is changed when a second switching voltage is applied to the magnetic memory element, an absolute value of the first switching voltage being greater than an absolute value of the second switching voltage.

7. A nonvolatile memory device comprising:
a semiconductor substrate including a trench, the trench being formed from a surface of the semiconductor substrate;
a ferroelectric gate dielectric layer disposed along an inner wall of the trench in the semiconductor substrate;
a gate electrode layer disposed on the ferroelectric gate dielectric layer, and connected to a word line;
a source electrode region disposed on a first side of the trench;
a drain electrode region disposed on a second side of the trench, the second side being an opposite side of the trench to the first side;
a first contact wire disposed over the drain electrode region;
a free layer, a tunnel barrier layer, and a fixed layer, which are sequentially disposed over the first contact wire; and
a second contact wire disposed over the fixed layer and connected to a bit line,
wherein the source electrode region is connected to a source line, wherein a polarization direction of the ferroelectric gate dielectric layer is changed when a first switching voltage is applied to the gate electrode layer, and a magnetization direction of the free layer is changed when a second switching voltage is applied between the free layer and the fixed layer, and
wherein an absolute value of the first switching voltage and an absolute value of the second switching voltage are different from each other.

8. The nonvolatile memory device of claim 7, wherein each of the source electrode region and the drain electrode region comprises a region of the semiconductor substrate doped with n-type or p-type dopants.

9. The nonvolatile memory device of claim 7, wherein the ferroelectric gate dielectric layer comprises at least one selected from the group consisting of hafnium oxide, zirconium oxide, and titanium oxide.

10. The nonvolatile memory device of claim 9, wherein the ferroelectric gate dielectric layer includes a dopant comprising at least one selected from the group consisting of yttrium (Y), zirconium (Zr), magnesium (Mg), silicon (Si), and barium (Ba).

11. The nonvolatile memory device of claim 7, wherein the magnetization directions of the free layer and the fixed layer are the same or opposite to each other according to a polarity of the second switching voltage applied between the free layer and the fixed layer.

12. The nonvolatile memory device of claim 7, wherein each of the free layer and the fixed layer comprises a ferroelectric metal or a ferroelectric oxide.

13. The nonvolatile memory device of claim 12, wherein each of the free layer and the fixed layer comprises at least one selected from the group consisting of iron (Fe), nickel (Ni), cobalt (Co), platinum (Pt), palladium (Pd), iron-boron (FeB), cobalt-iron-boron (CoFeB), cobalt-iron (CoFe), iron-platinum (FePt), terbium-cobalt-iron (TbCoFe), and cobalt-platinum (CoPt).

14. The nonvolatile memory device of claim 7, wherein an absolute value of the first switching voltage is greater than an absolute value of the second switching voltage.

15. A method of writing a signal in a nonvolatile memory device, the method comprising:
determining a target memory cell among a plurality of memory cells, the target memory cell comprising a ferroelectric memory element and a magnetic memory element, the ferroelectric memory element including a field effect transistor having a ferroelectric gate dielectric layer, the magnetic memory element being electrically connected in series to a drain electrode of the field effect transistor and having a free layer, a tunnel barrier layer, and a fixed layer;
changing a channel resistance in the ferroelectric memory element by applying a first switching voltage to a gate electrode of the field effect transistor of the target memory cell; and
changing a magnetic resistance in the magnetic memory element by applying a second switching voltage between the free layer and the fixed layer of the magnetic memory element of the target memory cell,
wherein changing the magnetic resistance and changing the channel resistance are performed sequentially.

16. The method of claim 15, wherein the magnetic resistance has a first magnetic resistance state and a second magnetic resistance state, the first magnetic resistance state being a relatively low resistance state, the second magnetic resistance state being a relatively high resistance state, wherein the channel resistance has a first channel resistance state and a second channel resistance state, the first channel resistance state being a relatively low resistance state, the second channel resistance state being a relatively high resistance state, and wherein the first and second magnetic resistance states and the first and second channel resistance states have different resistance values from each other.

17. The method of claim 15, wherein an absolute value of the first switching voltage is different from an absolute value of the second switching voltage.

18. The method of claim 17, wherein the absolute value of the first switching voltage is greater than the absolute value of the second switching voltage.

19. The method of claim 15, wherein changing the magnetic resistance comprises changing a magnetization direction of the free layer, wherein the magnetization direction is changed according to a polarity of the second switching voltage, and wherein changing the channel resistance is performed before or after changing the magnetic resistance.

20. The method of claim 15, wherein changing the channel resistance comprises changing a polarization direction of the ferroelectric gate dielectric layer, wherein the polarization direction is changed according to a polarity of the first switching voltage, and wherein changing the magnetic resistance is performed before or after changing the channel resistance.

* * * * *